United States Patent
Sun et al.

(10) Patent No.: US 7,670,866 B2
(45) Date of Patent: Mar. 2, 2010

(54) MULTI-DIE MOLDED SUBSTRATE INTEGRATED CIRCUIT DEVICE

(75) Inventors: Haixiao Sun, Shanghai (CN); Daoqiang Lu, Chandler, AZ (US); Aiying Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 11/746,553

(22) Filed: May 9, 2007

(65) Prior Publication Data

US 2008/0277781 A1 Nov. 13, 2008

(51) Int. Cl.
*H01L 21/00* (2006.01)
*H01L 21/44* (2006.01)
(52) U.S. Cl. .................. 438/64; 438/112; 438/126; 257/433; 257/787; 257/E23.001
(58) Field of Classification Search .................. 438/64, 438/112, 114, 126; 257/438, 787, E23.001, 257/433
See application file for complete search history.

(56) References Cited

U.S. PATENT DOCUMENTS

| 6,028,365 | A * | 2/2000 | Akram et al. ............... 257/778 |
| 2007/0045807 | A1 * | 3/2007 | Greenwood et al. ......... 257/690 |
| 2007/0262436 | A1 * | 11/2007 | Kweon et al. ............... 257/686 |

* cited by examiner

*Primary Examiner*—Hsien-ming Lee
(74) *Attorney, Agent, or Firm*—Konrad Raynes & Victor LLP

(57) ABSTRACT

One embodiment includes a substrate having a plurality of dies and a support frame made of molding material which is molded between adjacent dies so as to join together and support adjacent dies. The embodiment further has a plurality of interconnects formed on selected die terminals and the molding material of the support frame joining adjacent dies. The interconnects may be formed utilizing a variety of techniques including those of the type used in conventional wafer fabrication techniques. Other embodiments are described and claimed.

15 Claims, 4 Drawing Sheets

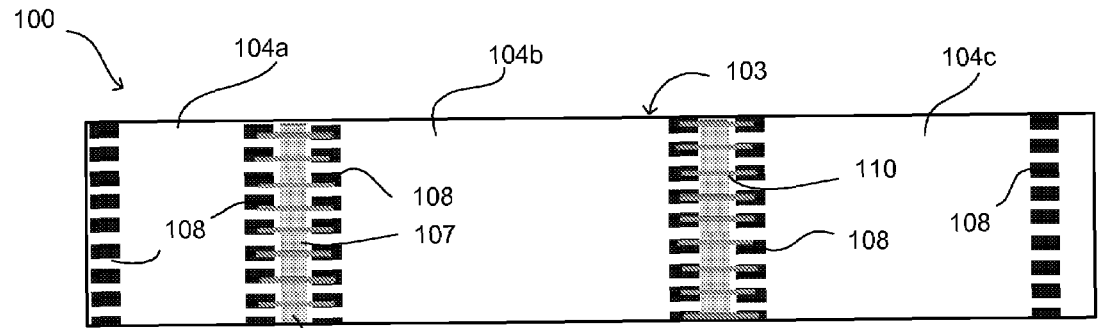
FIG. 3a
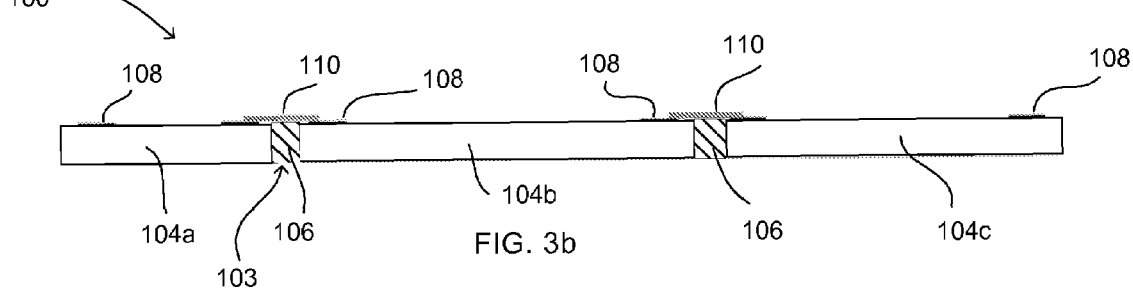
FIG. 3b
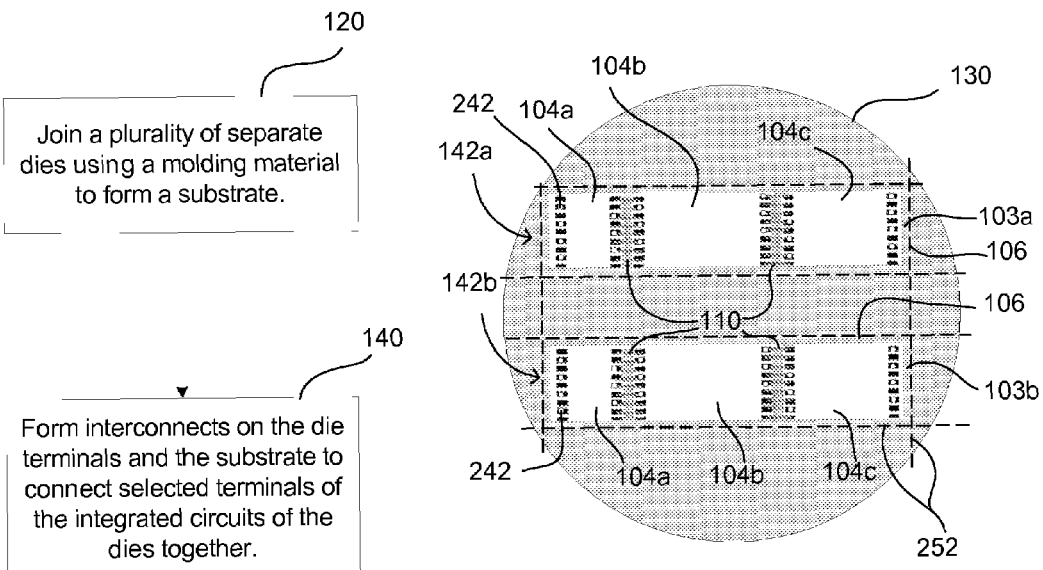
120
Join a plurality of separate dies using a molding material to form a substrate.
140
Form interconnects on the die terminals and the substrate to connect selected terminals of the integrated circuits of the dies together.
FIG. 4
FIG. 5

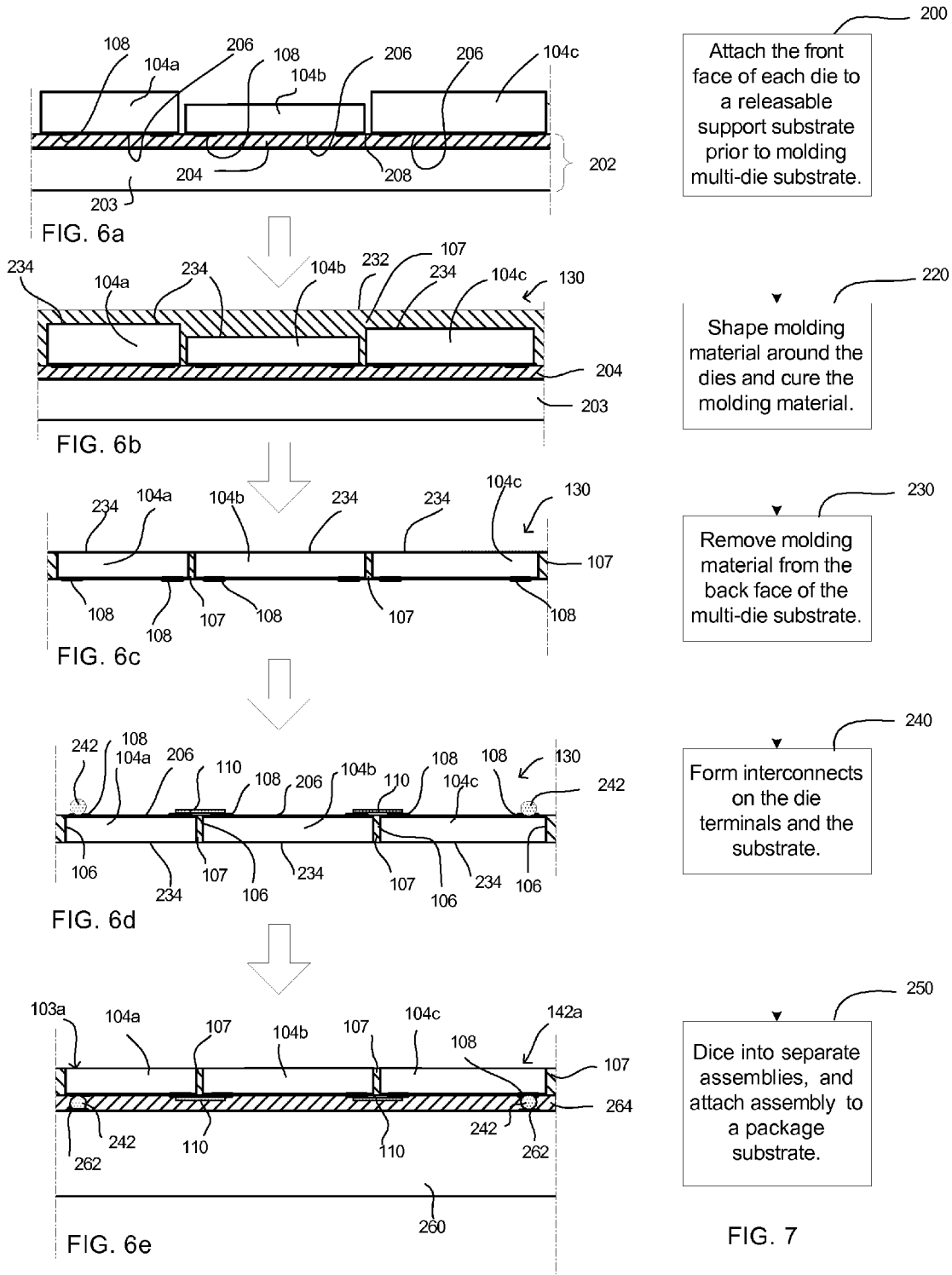

ly at 10. The stack 10 includes a first integrated circuit package 12, and a second integrated circuit package 14 which are physically and electrically connected together as shown in FIG. 1b using an interposer 16.

MULTI-DIE MOLDED SUBSTRATE INTEGRATED CIRCUIT DEVICE

BACKGROUND

Description of Related Art

Integrated circuits typically include various active and passive circuit elements which have been integrated into a piece of semiconductor material, often referred to as a die. The die may, in turn, be encapsulated into a package, which often includes a ceramic or plastic substrate although other materials may be used. These packages are usually attached to a printed circuit board, often by connecting pins arranged along the periphery of the package. In this manner, an electronic system can be assembled by connecting various integrated circuit packages to a printed circuit board.

In addition to mechanically connecting the integrated circuit package to the printed circuit board, the connecting pins also typically provide separate electrical connection terminals between the printed circuit board and the various inputs and outputs of the integrated circuit within the package. To increase the number of connection terminals, other package designs have been utilized. For example, in the pin grid array (PGA) and ball grid array (BGA) packages, a large number of input/output (I/O) connection terminals are disposed in a two dimensional array over a substantial portion of a major surface of the package.

To increase space utilization, two or more integrated circuit dies may be attached to a printed circuit board in a stacked arrangement. The dies may be interconnected in a die-to-die stacked arrangement. Alternatively, each die may be placed in a package and the two packages may be stacked in a package-to-package arrangement. FIG. 1a shows an exploded view of one such known package-to-package stack indicated generally at 10. The stack 10 includes a first integrated circuit package 12, and a second integrated circuit package 14 which are physically and electrically connected together as shown in FIG. 1b using an interposer 16.

The integrated circuit package 12 includes a package substrate 20 on which an integrated circuit die 22 is mechanically and electrically connected by a plurality of solder bumps 24. Similarly, the integrated circuit package 14 includes a package substrate 26 to which an integrated circuit die 28 is mechanically and electrically connected by a plurality of solder bumps 30. Other electrical connectors including wires may be used in place of or in addition to the solder bumps 24, 30. The package substrates 20, 26 may have both internal and exterior conductors which are electrically connected to the solder bumps 24, 30 or to contact pads on the dies 22, 28.

The dies 22, 28 may be encapsulated in a polymer such as an epoxy layer 32 depicted for the die 28. The inputs and outputs of the stack 10 may be electrically connected to a printed circuit board using connection pins, solder bumps or other connection terminals.

As best seen in FIG. 1c, the interposer 16 includes a generally rectangular ring-shaped frame 34 which may be constructed of a dielectric material such as plastic or ceramic, for example. The frame 34 has a plurality of apertures distributed about its periphery into which plugs 36 may be punched into the frame apertures and secured therein in an interference fit. The plugs 36 are typically formed of an electrically conductive material such as copper and may each be bonded to aligned contact pads 40 and 42 of the package substrates 20 and 26, respectively, as shown in FIG. 1b. The copper plugs 36 may be bonded to the contact pads 40, 42 of the package substrates 20, 26 using stencil printed solder or other materials including electroplated solder, ink jet solder or adhesives or using other bonding techniques including thermocompression and thermosonic joining.

Each plug 36 can provide a separate electrical interconnection between the packages 12 and 14. The center to center spacing or "pitch" between adjacent force fit plugs 36 may be as low as 300 microns, in some applications. Interposers may be used to provide die-to-die or die-to-package substrate interconnections.

BRIEF DESCRIPTION OF THE DRAWINGS

Referring now to the drawings in which like reference numbers represent corresponding parts throughout:

FIGS. 3a and 3b are top and side views, respectively of a multi-die molded substrate integrated circuit device in accordance with one embodiment of the present description;

FIG. 4 is a flow chart depicting one example of operations for fabricating a multi-die molded substrate integrated circuit device in accordance with one embodiment of the present description;

FIG. 5 is a schematic top view of one example of a multi-die substrate in accordance with the present description molded in the shape of a semiconductor wafer;

FIGS. 6a-6e illustrate various stages in the fabrication of multi-die molded substrate integrated circuit device in accordance with one embodiment of the present description; and FIG. 7 is a flow chart depicting another example of operations for fabricating a multi-die molded substrate integrated circuit device in accordance with one embodiment of the present description.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1A:
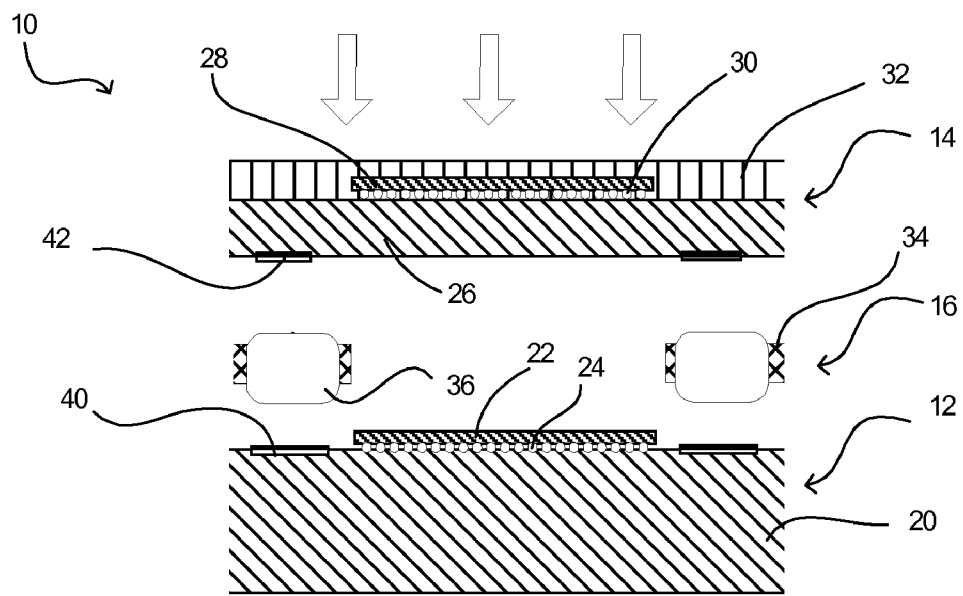
FIGS. 1a and 1b schematically illustrate a prior art interposer connecting integrated circuit packages in a package-to-package stack.
Figure 1B:
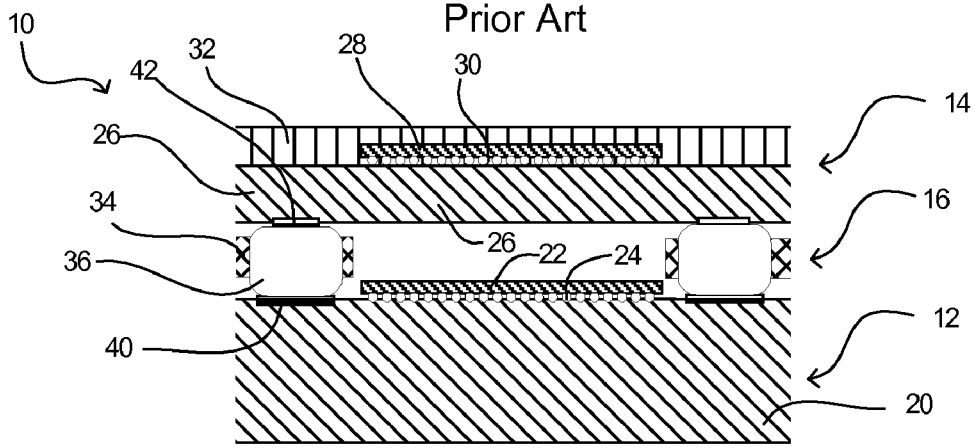
Figure 1C:
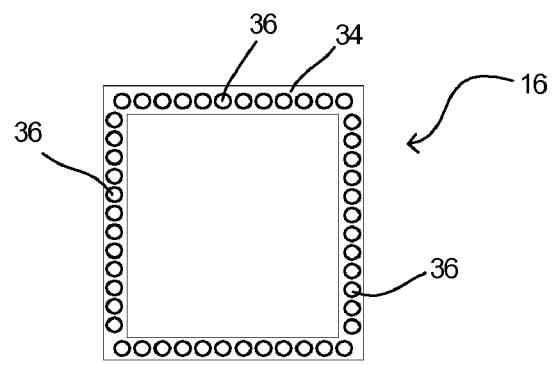
FIG. 1c is a top schematic view of the prior art interposer of FIGS. 1a and 1b.
Figure 2:
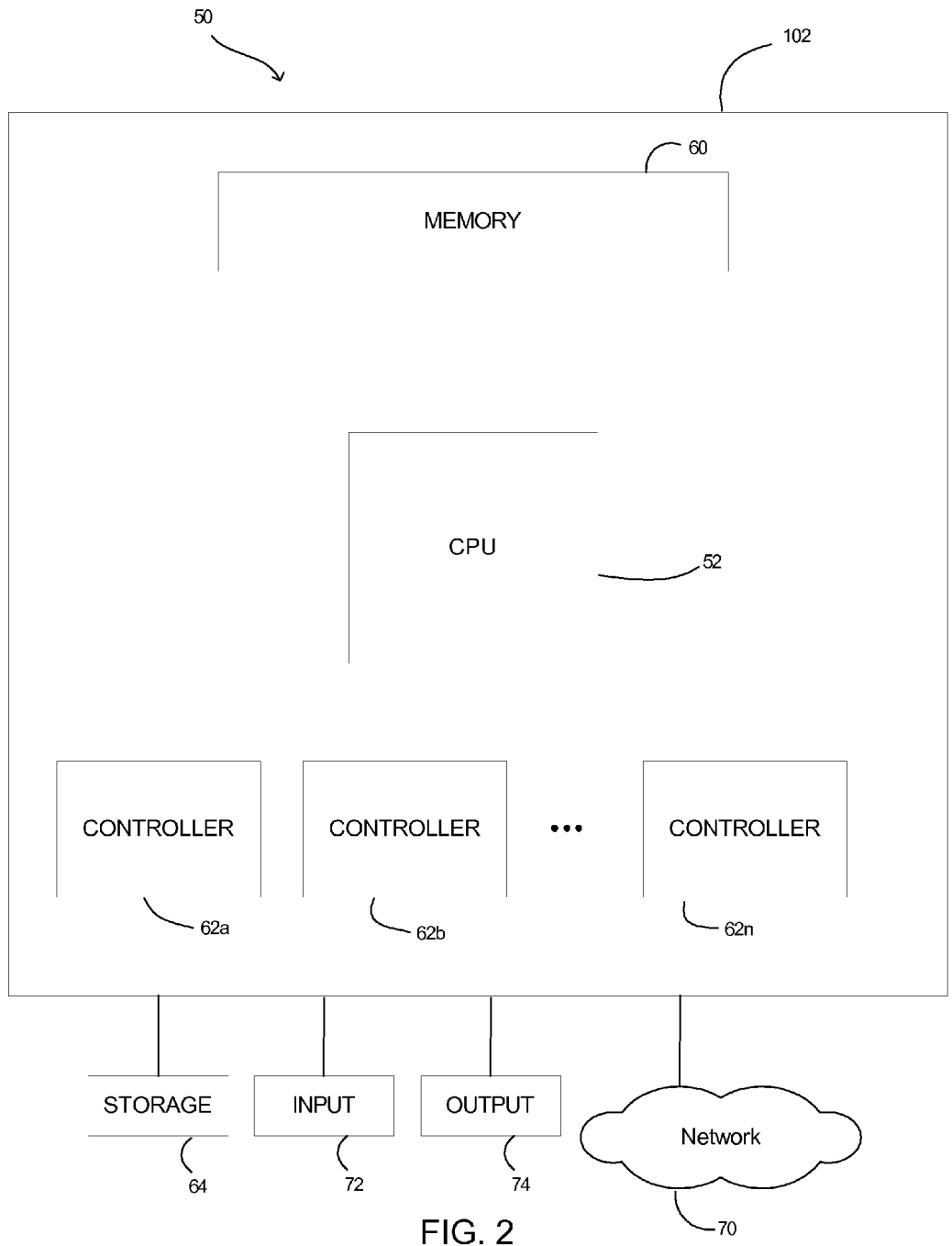
FIG. 2 illustrates one embodiment of a computing environment in which aspects of the description provided herein are embodied.

FIG. 2 illustrates a computing environment in which aspects of described embodiments may be embodied. A computer 50 includes one or more central processing units (CPU) 52 (only one is shown), a memory 60 (e.g., a volatile memory device), and a plurality of controllers 62a, 62b . . . 62n. Each of the CPU 52, and controllers 62a, 62b . . . 62n include one or more electronic devices. Once such electronic device is represented by an electronic device 100 (FIGS. 3a, 3b) which is electrically and mechanically coupled to a printed circuit board 102. In accordance with one aspect of the present description, the device 100 of this embodiment includes a substrate 103 having a plurality of dies 104a, 104b, 104c and a support frame 106 made of molding material 107 which is molded between adjacent dies 104a, 104b, 104c so as to join together and support adjacent dies 104a, 104b, 104c. Each die 104a, 104b, 104c has one or more integrated circuits and a plurality of terminals 108 electrically coupled to the integrated circuit of the particular die.

In accordance with another aspect of the present description, the device 100 further has a plurality of interconnects 110 formed on selected die terminals and the molding material 107 of the support frame 106 joining adjacent dies of the dies 104a, 104b, 104c. As explained in greater detail below, the interconnects 110 may be formed utilizing a variety of techniques including those of the type used in conventional wafer fabrication techniques. In the illustrated embodiment, the resulting pitch or spacings of the interconnects 110 may, depending upon the particular application, be relative fine by comparison to other multi-die packaging techniques. It is appreciated that in other applications, features other than fine pitch spacings between interconnects may be realized in addition thereto or instead of, in utilizing a multi-die molded substrate integrated circuit device in accordance with the present description.

The printed circuit board 102 (FIG. 2) may be a single layer or multi-layered motherboard which has a plurality of conductive lines that provide communication between the circuits in the device 100 and other components mounted to the board 102. Alternatively, one or more of the CPU 52, memory 60 and controllers 62a, 62b . . . 62n may be disposed on other cards such as daughter cards or expansion cards.

An operating system and various applications execute on the CPU 52 and reside in the memory 60. The content residing in memory 60 may be cached in accordance with appropriate caching techniques. Programs and data in memory 60 may be swapped into storage 64 (e.g., a non-volatile storage, such as magnetic disk drives, optical disk drives, a tape drive, etc.) as part of memory management operations. The computer 50 may comprise any computing device, such as a mainframe, server, personal computer, workstation, laptop, handheld computer, telephony device, network appliance, virtualization device, storage controller, network controller, etc. Any suitable CPU 52 and operating system may be used. The computer 50 may also employ dedicated processors in addition to or instead of a CPU.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of suitable storage protocols. Data being written to or read from the storage 64 may be cached in accordance with appropriate caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other suitable network communication protocol. In some embodiments, the computer 50 may not be connected to a network 70 or may lack storage 64.

A video controller can render information on a display monitor, and may be embodied on a video card or integrated on integrated circuit components mounted on the motherboard. Certain of the devices may have multiple cards or controllers. An input device 72 is used to provide user input to the computer 50, and may include a keyboard, mouse, pen-stylus, microphone, touch sensitive display screen, or any other suitable activation or input mechanism. An output device 74 is capable of rendering information transmitted from the processor CPU 52, or other component, such as a display monitor, printer, storage, etc.

In certain embodiments, the multi-die molded substrate embodiments may be embodied in a computer system including a video controller to render information to display on a monitor coupled to a computer system comprising a desktop, workstation, server, mainframe, laptop, handheld computer, etc. Alternatively, the multi-die molded substrate embodiments may be embodied in a computing device that does not include a video controller, such as a switch, router, etc.

A network controller or other devices described herein may be mounted on an expansion card, such as a Peripheral Component Interconnect (PCI) card, PCI-express or some other I/O expansion card coupled to a motherboard, or on integrated circuit components mounted on the motherboard. Integrated circuit dies may be packaged individually, stacked in packages or may utilize a multi-die molded substrate in accordance with the description provided herein. Thus, multi-die molded substrate embodiments may be embodied in computer systems or other systems in which a multi-die molded substrate in accordance with the present description is mounted on one or both of a motherboard and an expansion card. Accordingly, in some system embodiments, the system may lack an expansion card, and a multi-die molded substrate in accordance with the present description may be mounted on a motherboard. In another system embodiment, a multi-die molded substrate in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

FIG. 4 shows an example of operations to fabricate a multi-die molded substrate integrated circuit device in accordance with one embodiment of the present description. In one operation, a plurality of separate dies are joined (block 120) using a molding material to form a substrate having the plurality of dies joined together with molding material between adjacent dies. Each die has an integrated circuit formed thereon. In one embodiment, the substrate may be molded in the shape of a semiconductor wafer. For example, FIG. 5 shows a substrate 130 in which molding material has been molded around the separate dies 104a, 104b, 104c in the shape and size resembling a conventional semiconductor wafer, wherein the molding material 107 fills spaces between the dies 104a, 104b, 104c.

As used herein, the term "molding" refers to shaping a malleable or fluid like material having a suitable viscosity susceptible to shaping, and may utilize molds in some shaping processes but may not utilize molds in other shaping processes. The term "molding material" refers to any material which has an initial malleable or fluid like state which is susceptible to being shaped, and may be subsequently cured to a hardened or stiff, solid state in which the cured material is capable of binding dies together and providing structural support to the dies. Examples of suitable molding materials include polymers such as polymeric molding compounds used in wire bonding. Polymeric molding compounds are electrically insulating and are often used to protect conductive wire bonds in a wire bonded package. It is appreciated that a wide variety of materials are suitable molding materials.

As used herein, "curing" refers to any process which causes a molding material to transition from its initial malleable or fluid like state, and to the subsequent hardened or stiff, solid state. Curing may involve subjecting the molding material to a raised temperature, or adding additional materials such as epoxy part a or epoxy part b, for example. Other curing processes may involve simply allowing the molding material to set for a particular length of time and may not involve raised temperatures or added components. It is appreciated that the particular curing processing may depend upon the particular molding material utilized.

A molded wafer may be relatively flat and thin and may be circular in shape as shown in FIG. 5 to resemble a conventional semiconductor wafer. However, it is appreciated that a molded wafer as described herein may be molded into any suitable shape, thickness and contour, depending upon the particular application.

In another operation, interconnects may be formed (block 140, FIG. 4) on the die terminals and substrate to connect selected terminals of the integrated circuits of the dies together. In the example of FIG. 5, the dies 104a, 104b, 104c have been joined by the molding material 107 into a first assembly 142a of dies 104a, 104b, 104c, and also into a second assembly 142b of dies 104a, 104b, 104c. Two such assemblies are depicted for purposes of illustration. It is appreciated that a substrate 130 having the size and shape of a conventional semiconductor wafer may have tens, hundreds or more of such assemblies of dies, depending upon the sizes of the dies and the number of dies in each assembly. In the illustrated embodiment, the interconnects 110 of all the assemblies of the wafer shaped substrate 130 may be formed in a single process or series of processes utilizing conventional interconnect fabrication processes developed for semiconductor type wafers, for example.

FIGS. 6a-6e and 7 show a more detailed example of operations to fabricate a multi-die molded substrate integrated circuit device in accordance with one embodiment of the present description. In one operation, various dies may be selected such as a CPU die, a dynamic random access memory (DRAM) die, a controller die, etc and attached (block 200) to a releasable support substrate prior to molding the multi-die substrate. FIG. 6a shows one example of a plurality of dies 104a, 104b, 104c being attached to a releasable support substrate 202 having a support member 203 and an adhesive layer 204 temporarily binding the dies 104a, 104b, 104c to the support substrate 202. The adhesive layer 204 may be double-sided tape, for example. It is appreciated that other techniques may be utilized to releasably secure the dies 104a, 104b, 104c to the support substrate 202.

The releasable support substrate 202 may be sized and shaped to match that of a conventional semiconductor wafer. As a result, the fabricated multi-die molded substrate can likewise be shaped to match the size and shape of a semiconductor wafer. Such a size and shape can facilitate using existing tools and processes developed for forming interconnects on semiconductor wafers. It is appreciated that other sizes and shapes may be utilized for a releasable support substrate, depending upon the particular application.

In the illustrated embodiment, the front faces 206 of each die of the dies 104a, 104b, 104c are temporarily attached to the generally planar face 208 of the support substrate 202. As used herein, the term "front face" refers to that face of an integrated circuit die on which the integrated circuit is primarily fabricated and that face on which the integrated circuit terminals are primarily integrated. Conversely, the term "back face" refers to that face of an integrated circuit die opposite the front face.

Attaching the dies front face down to the planar face 208 of the releasable support substrate facilitates securing the front faces 206 of the dies 104a, 104b, 104c with their associated terminals 108 in a generally coplanar relationship with respect to the front faces 206 and terminals 108 of the other dies of the assembly being fabricated. As will be explained in greater detail below, such a coplanar relationship facilitates forming the interconnects on the terminals of the dies and also facilitates connecting the resultant multi-die molded substrate to the terminals of a package or printed circuit board.

In another operation, soft molding material 107 is shaped (block 220) around the dies 104a, 104b, 104c and then cured to a hardened state to form a molded wafer as shown in FIG. 6b and as described above in connection with FIGS. 4, 5. The substrate 130 with the hardened molding material is, in the illustrated embodiment, self supporting such that the temporary support substrate 202 may be removed as shown in FIG. 6c. In other embodiments, a support substrate may be left in place.

Hardened molding material 107 may also be removed (block 230) from the back face 232 of the multi die substrate 130. In addition, a portion of the back face 234 of one or more of the dies 104a, 104b, 104c may be removed as well as shown in FIG. 6c, until the thicknesses of the dies 104a, 104b, 104c are substantially uniform.

A variety of processes may be utilized to remove hardened molding material or die material from the multi-die substrate 130. For example, polishing or backgrinding may be utilized. It is appreciated that in some applications, removal of molding material or die material from the substrate 130 may not be appropriate, depending upon the particular application. However, in those applications in which material is removed from the molded substrate 130, the resulting thickness of the substrate 130 may be uniform or nonuniform, depending upon the particular application.

In the illustrated embodiment of FIG. 6c, the back face 234 of each die 104a, 104b, 104c of the assemblies 142a, 142b (FIG. 5) is exposed on the back face of the multi-die substrate 130. Such an arrangement may facilitate connecting terminals to one or more of the die back faces 234 or may facilitate handling of the substrate 130 in conventional wafer processing tools and processes, or may facilitate other features, depending upon the particular application. It is appreciated that in other applications, the back face 234 of some dies of the assembly may not be exposed in the substrate 130.

In another operation, interconnects may be formed (block 240, FIG. 7) on the die terminals and molding material on the front face 206 of the substrate 130 as shown in FIG. 6d, to connect selected terminals of the integrated circuits of the dies 104a, 104b, 104c as described above in connection with FIGS. 4 and 5. In addition to the interconnects 110 interconnecting terminals 108 of the various integrated circuits of the dies of each assembly, 142a, 142b, external connection terminals 242 such as solder balls may be deposited or otherwise formed on terminals 108 of the integrated circuits of the assemblies 142a, 142b, to interconnect a particular assembly 142a, 142b with a package terminal, interposer, stacked die terminal or terminals of other devices as described below. In the illustrated embodiment, the die-to-die interconnects 110 and external connection terminals 242 of all the assemblies of the wafer shaped substrate 130 may be formed utilizing conventional terminal and interconnect fabrication processes developed for semiconductor type wafers, for example. Other processes may be used, depending upon the particular application.

One example by which interconnects and connection terminals may be formed on a multi-die molded substrate includes depositing a seed layer of a suitable conductive seed material such as titanium, for example. Suitable deposition processes include electroplating, physical vapor deposition, chemical vapor deposition. Another conductive material such as copper or aluminum, for example, may be deposited on the seed layer by a suitable deposition process including electroplating, physical vapor deposition, or chemical vapor deposition. The individual interconnects and terminals may be shaped by applying a photoresist layer which is patterned in accordance with the layout of the terminals and interconnects, and the conductive layers may be etched to form the terminals and interconnects. It is appreciated that a variety of processes may be used and the number of conductive layers may vary.

In the illustrated embodiment, the various interconnects 110 or terminals 242 may be spaced relatively closely together using appropriate conductor formation techniques as set forth above. For example, it is believed that the interconnects 110 may be spaced at a pitch of 50-200 microns. Other pitches, larger or smaller, may be appropriate, depending upon the particular application.

The various interconnects 110 or terminals 242 shown in FIG. 5 are representative and simplified for clarity. An actual multi-die substrate in accordance with the present description may have tens, hundreds or more such die to die interconnects 110 and external connection terminals 242. For example, each die of the dies 104a, 104b, 104c may have a two dimensional array of external connection terminals 242 such as ball grid arrays (BGA), land grid arrays (LGA), etc.

In yet another operation, a multi-die substrate may be diced (block 250, FIG. 7) or otherwise cut to separate the assemblies 142a, 142b into individual assemblies, wherein each separated assembly 142a, 142b may be attached to a package substrate or otherwise packaged for use. FIG. 5 shows one example of cut lines 252 by which individual assemblies 142a, 142b may be separated into portions 103a, 103b of the wafer shaped substrate 130. The amount of hardened molding material which may be removed from around each die 104a, 104b, 104c, may vary, depending upon the particular application. The remaining hardened molding material around the dies 104a, 104b, 104c forms the support frame 106 which physically supports the dies and physically joins them together as a relatively stiff, unitary member which may be handled independently of a support substrate such as the substrate 202.

FIG. 6e shows an example of a multi-die substrate portion 103a which includes the die assembly 142a being physically coupled to and electrically connected to a package substrate 260 which may be mounted on a printed circuit board or other structure. The die assembly 142a may be electrically connected to terminals 262 of the package substrate 260 by soldering or otherwise connecting the connection terminals 242 of the assembly 142a to the package substrate terminals 262. The package substrate 260 may have an encapsulation or other layer 264 to physically bind the assembly 142a to the substrate 260. The layer 264 may enhance thermal conductivity from the assembly 142a to the package substrate 260 for heat dissipation purposes. The layer 264 may be made of a suitable polymer or other material. The multi-die molded substrate 103a may also be fully encapsulated in a package which includes a substrate such as the substrate 260.

In the illustrated embodiment, a multi-die molded substrate 103a is shown mounted on and connected to a package substrate. It is appreciated that a variety of electrical devices may be fabricated using a multi-die molded substrate in accordance with the present description. Such a multi-die molded substrate may be mounted on other connection devices including interposers, flexible substrates, printed circuit boards, or other integrated circuit devices including individual dies, or other multi-die molded substrates. The inputs and outputs of the package substrate 260 may be electrically connected to a printed circuit board or other structure using connection terminals which may include connection pins, solder bumps or other connection devices.

Additional Embodiment Details

The illustrated operations of FIGS. 4, 6a-6e, and 7 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

The foregoing description of various embodiments has been presented for the purposes of illustration and explanation. It is not intended to be exhaustive or to limit to the precise form disclosed. Many modifications and variations are possible in light of the above teaching.

What is claimed is:

1. A method, comprising:
    joining a plurality of separate, generally coplanar dies using a molding material to form a molded substrate having said plurality of dies joined together with molding material between adjacent dies, each die having an integrated circuit and a plurality of terminals electrically coupled to the integrated circuit of the die; and
    forming interconnects on said die terminals and the molded substrate to electrically connect selected terminals of said integrated circuits of at least two generally coplanar dies of said dies together;
    wherein said joining includes molding said molding material in the shape of a semiconductor wafer around the separate dies wherein the molding material fills spaces between the dies, and curing the molding material until it hardens sufficiently to support the dies, and wherein said interconnect forming includes forming said interconnects on said molding material between the dies after the molding material is cured and hardened to electrically connect at least two generally coplanar dies together.

2. The method of claim 1 wherein said joining includes attaching a front face of each die to a releasable support substrate prior to molding the wafer, wherein the integrated circuit and terminals of the die are positioned on the front face of each die.

3. The method of claim 1 wherein said interconnect forming includes depositing conductive material on the selected die terminals and on the molding material joining adjacent dies.

4. The method of claim 3 wherein said interconnect forming includes forming a plurality of interconnects spaced at a pitch of 50 to 200 microns.

5. The method of claim 3 further comprising forming additional terminals on the front face of the dies wherein said additional terminals are adapted to be connected to terminals of a semiconductor package.

6. The method of claim 5 further comprising dicing the molded substrate into separate assemblies, each assembly comprising a plurality of dies joined by molding material and interconnected with said interconnects, and a plurality of said additional terminals.

7. The method of claim 6 further comprising attaching an assembly of said assemblies to a package substrate, said attaching including connecting said additional terminals of said assembly to terminals of said package substrate.

8. A method, comprising:

joining a plurality of separate, generally coplanar dies using a molding material to form a molded substrate having said plurality of dies joined together with molding material between adjacent dies, each die having an integrated circuit and a plurality of terminals electrically coupled to the integrated circuit of the die; and forming interconnects on said die terminals and substrate to electrically connect selected terminals of said integrated circuits of at least two generally coplanar dies of said dies together;

wherein said joining includes attaching a front face of each die to a releasable support substrate prior to molding the wafer, wherein the integrated circuit and terminals of the die are positioned on the front face of each die; and wherein said interconnect forming includes removing molding material from a back face of the molded substrate and removing a portion of die from at least one die until all dies which have an initial different thickness are exposed and the dies have a common predetermined thickness, and removing the releasable support substrate to expose the front face of each die.

9. The method of claim 8 wherein said interconnect forming includes depositing conductive material on the selected die terminals and on the molding material joining adjacent dies.

10. The method of claim 9 wherein said interconnect forming includes forming a plurality of interconnects spaced at a pitch of 50 to 200 microns.

11. The method of claim 9 further comprising forming additional terminals on the front face of the dies wherein said additional terminals are adapted to be connected to terminals of a semiconductor package.

12. The method of claim 11 further comprising dicing the molded substrate into separate assemblies, each assembly comprising a plurality of dies joined by molding material and interconnected with said interconnects, and a plurality of said additional terminals.

13. The method of claim 12 further comprising attaching an assembly of said assemblies to a package substrate, said attaching including connecting said additional terminals of said assembly to terminals of said package substrate.

14. A method, comprising:

joining a plurality of separate dies using a molding material to form a molded substrate having said plurality of dies joined together with molding material between adjacent dies, each die having an integrated circuit and a plurality of terminals electrically coupled to the integrated circuit of the die, wherein said joining includes attaching a front face of each die to a releasable support substrate prior to joining dies using molding material, wherein the integrated circuit and terminals of the die are positioned on the front face of each die; and forming interconnects on said terminals and substrate to connect selected terminals of said integrated circuits of said dies together, wherein said interconnect forming includes removing molding material from a back face of the molded substrate and removing a portion of die from at least one die until all dies which have an initial different thickness are exposed and the dies have a common predetermined thickness, and removing the releasable support substrate to expose the front face of each die.

15. The method of claim 14 wherein said joining includes molding said molding material in the shape of a semiconductor wafer around the separate dies wherein the molding material fills spaces between the dies, and curing the molding material until it hardens sufficiently to support the dies.

* * * * *